United States Patent [19]

Kolesnikov et al.

[11] Patent Number: 4,916,742
[45] Date of Patent: Apr. 10, 1990

[54] METHOD OF RECORDING AND READING AUDIO INFORMATION SIGNALS IN DIGITAL FORM, AND APPARATUS FOR PERFORMING SAME

[76] Inventors: Viktor M. Kolesnikov, ulitsa Dibunovskaya, 37, kv. 3I; Mikhail U. Bank, ulitsa Sofiiskaya, 40, korpus I, kv. I2I; Ilya M. Lazer, prospekt Toreza, 33, kv. 44; Gennady S. Brailovsky, 7 Sovetskaya ulitsa, I6, kv. 17; Viktor I. Prygun, ulitsa Dzerzhinskogo, 33/37, kv. 3I, all of, Leningrad, U.S.S.R.

[21] Appl. No.: 171,007

[22] PCT Filed: Apr. 24, 1986

[86] PCT No.: PCT/SU86/00036

§ 371 Date: Dec. 18, 1987

§ 102(e) Date: Dec. 18, 1987

[87] PCT Pub. No.: WO87/06783

PCT Pub. Date: Nov. 5, 1987

[51] Int. Cl.⁴ .............................................. G10L 3/02
[52] U.S. Cl. ........................................ 381/30; 381/31
[58] Field of Search ................................. 381/29–35; 364/513.5; 369/25, 50

[56] References Cited

U.S. PATENT DOCUMENTS

| | | | |
|---|---|---|---|
| 4,020,292 | 4/1977 | Charlot et al. | 364/514 |
| 4,093,831 | 6/1978 | Sharp et al. | 369/25 |
| 4,130,739 | 12/1978 | Patten | 369/25 |
| 4,291,405 | 9/1981 | Jayant et al. | 381/36 |
| 4,376,874 | 3/1983 | Karban et al. | 381/34 |
| 4,382,160 | 5/1983 | Gosling et al. | 381/31 |
| 4,435,831 | 3/1984 | Mozer | 381/35 |
| 4,550,425 | 10/1985 | Andersen et al. | 381/30 |
| 4,701,937 | 10/1987 | Wan et al. | 381/35 |
| 4,759,067 | 7/1988 | Page | 381/36 |

OTHER PUBLICATIONS

CMOS Logic GD4000 Series Data Book, Goldstar Semiconductor, Ltd., Catalogue, DB8612-002X, pp. 225, 296, 297.
GSS TTL Data Book, Goldstar Semiconductor, Catalogue, DT8610-002A, pp. 4-92-96, 4-236, 237, 246-249, 5-47-50, 70-72 and 4-238.

Primary Examiner—David L. Clark
Assistant Examiner—David D. Knepper
Attorney, Agent, or Firm—Lilling & Greenspan

[57] ABSTRACT

The method of recording and reading audio information signals in digital form includes detecting, during time compression of digital signals, a chain of code values of the digital signal corresponding to a pause in the audio signal, measuring the duration of this chain of code values of the digital signal and shaping a pause identifier code and a pause duration code for subsequent recording with the digital signal. Furthermore, in the reading mode, time decompression of the digital signal includes detecting the pause identifier code and the pause duration code and using them to restore the duration of said chain of code values of the digital signal. To perform this method, the apparatus comprises a pause decoder (17), a pause identifier code shaper (18), a pause identifier code decoder (19), a condition (20) of pause duration count control signals and a pause duration counter (21).

19 Claims, 7 Drawing Sheets

METHOD OF RECORDING AND READING AUDIO INFORMATION SIGNALS IN DIGITAL FORM, AND APPARATUS FOR PERFORMING SAME

BACKGROUND OF THE INVENTION

1. Field of the Invention

The present invention relates to methods of digital processing of signals and to apparatus for performing such methods, and more particularly it relates to methods of recording and reading audio information signals in digital form and to apparatus for performing such methods.

2. Description of the Prior Art

There is known a method of recording and reproducing audio information signals in digital form, according to which a digital signal is directly recorded in a solid-state storage unit. The information thus stored is read out in the very same form in which it has been recorded in the storage (see, for example, DE,A, No. 2826870).

There is also known an apparatus for recording and reading audio information signals in digital form, capable of performing the above method and comprising a series connection of an analog-to-digital (a-d) converter, a solid-state storage unit, a digital-to-analog (d-a) converter, and also an address counter having its outputs connected to the control inputs of the storage unit (see the above-cited Patent).

The above method of recording and reproducing audio information signals in digital form and the above apparatus for performing this method have their capabilities limited by a signal being recorded in a real-time mode, i.e. without compression, so that volumes of processed information are limited.

There is further known a method of recording and reading audio information signals in digital form, including time compression of digital signals with their subsequent recording, and reading the digital signals with their time decompression (see, for Example, U.S. Pat. No. 3860760).

In this method the time compression of digital signals with their subsequent recording is effected by uniform compaction of all the components of a signal in time, thus converting the signal into a different frequency range, which allows storage of substantially greater volumes of data.

In the readout mode, time decompression of digital signals is effected by uniformly extending in time all the signal components, and converting the signal to real-time form.

There is further known an apparatus for recording and reading audio information signals in digital form, capable of performing the last-described method which comprises a series connection of a data input unit, a storage unit and a data output unit, the data input unit having main data inputs and outputs. The control inputs of the data input unit and of the data output unit, respectively, and the timing input of the storage unit have connected thereto the respective outputs of a driver or control unit. The main control inputs of the control unit and the main data outputs of the data output unit are, respectively, the "timing", "recording", "stop" and "repeat" control inputs and the data outputs of the apparatus also have data inputs (see the last-mentioned U.S. Patent).

The last-described method of recording and reading audio information signals in digital form, and the last-described apparatus performing this method have their functioning capabilities extended owing to their ability to compress the digital signals. However, their capabilities are still limited by the fact that all the components of a signal, pauses included, are uniformly subjected to compaction, so that the relative shares of both the useful signals and pauses remain the same in the storage unit notwithstanding the compression.

SUMMARY OF THE INVENTION

It is an object of the present invention to create a method of recording and reading audio information signals in digital form, wherein the time compression of digital signals in recording and the time decompression of digital signals in reading out should be performed so as to increase the volume of recorded information, and to create an apparatus for recording and reading audio information signals in digital form capable of performing this method and having units with their corresponding connections, allowing increase in the volume of recorded information with the same storage capacity, or else to reduce the required capacity of the storage unit with the same duration of recording, i.e. to bring down the cost of the apparatus.

This object is attained in a method of recording and reading audio information signals in digital form, including time compression of digital signals with their subsequent recording and reading out the digital signals with their time decompression in the method in accordance with the invention, the time compression of digital signals includes detecting a chain or sequence of code values of a digital signal, corresponding to a pause in an audio signal, measuring the duration of the chain of code values of the digital signal, corresponding to the pause in the audio signal, and generating a pause identifier code and a pause duration code for their subsequent recording with the digital signal. Reading out the time decompression of digital signals includes detecting the pause identifier code and the pause duration code, and using them for restoring the duration of the chain of code values of the digital signal, corresponding to the pause in the audio signal.

To enhance the accuracy of reading out a digital signal, it is expedient that prior to time compression of digital signals the code values of the digital signal be compared with the predetermined pause identifier code. In case of positive comparison the code value of the digital signal is distorted by altering one of the minor symbols of the code value of the digital signal.

To prevent reading out of false pauses, it is desirable that in case of occurrence in the digital signal of two successive pauses, the recording of the duration code of the preceding pause be followed by the recording of the indentifier code of the successive pause not earlier than after a time interval corresponding to the maximum duration of the pause duration code. In the reading out, prior to time decompression of the digital signals, the generation of the first pause is additionally allowed only if its identifier code appears not earlier than after a time interval corresponding to the maximum duration of the pause duration code from the moment of the beginning of the reading out of the audio signal, and if a pause identifier code appears during this time, the decoding of this pause identifier code is inhibited, and a new counting of the time interval corresponding to the maximum duration of the pause duration code is initiated.

To provide for variability of the tempo of reproduction of an audio signal without altering its pitch, it is expedient that a pause duration code be converted into another predetermined pause duration code corresponding to a predetermined reproduction tempo.

It is further expedient that the conversion of a pause duration code into another predetermined pause duration code corresponding to a predetermined reproduction tempo is effected during the reading out.

The object is also attained in an apparatus for recording and reading audio information signals in digital form, capable of performing the above method and comprising a series connection of a data input unit, a storage unit and a data output unit. The data input unit has main data inputs and outputs, the control inputs, respectively, of the data input unit and data output unit and the timing input of the storage unit has connected thereto the corresponding outputs of a control unit. The main control inputs of the control unit and the main data outputs of the data output unit are, respectively, the "timing", "record", "stop" and "playback" control inputs and the data outputs of the apparatus also having data inputs. The apparatus, in accordance with the present invention, comprises a series connection of a pause decoder and a pause identifier code shaper, and a series connection of a main pause identifier code decoder, a conditioner of pause duration count control signals and a pause duration counter. The additional data outputs of the data input unit are connected to the respective inputs of the pause decoder, and the outputs of the pause identifier code shaper and of the pause duration counter are connected, respectively, to the corresponding additional data inputs of the data input unit. The additional data outputs of the data output unit are connected to the corresponding inputs of the main pause identifier code decoder, the outputs of the storage are additionally connected to the corresponding inputs of the conditioner of pause duration count control signals. The output of the pause decoder is additionally connected to an additional input of the control unit and to the corresponding input of the conditioner of the pause duration count control signals having connected to one of the control inputs thereof the output "P" of the pause duration counter. The other control inputs are the "timing", "record" and "playback" control inputs of the apparatus. The additional control inputs of the control unit are connected to the corresponding outputs of the conditioner of the pause duration count control signals, the input "C" of the pause duration counter and the corresponding inputs of the pause identifier code shaper being the "timing" and "record" control inputs of the apparatus.

To enhance the accuracy of reproduction of an audio signal, it is expedient that the apparatus should further comprise a series connection of an audio signal code corrector and an additional pause identifier code decoder. The data inputs of the corrector are the data inputs of the apparatus, the outputs of the audio signal code corrector being connected to the corresponding data inputs of the data input unit. The inputs of the additional pause identifier code decoder are connected to additional data outputs of the data input unit, and the output thereof is connected to the control input of the audio signal code corrector.

To avoid reproduction of false pauses, it is expedient that the apparatus should additionally comprise a counter of binary words of the pause duration code, a main switching unit, a conditioner of a signal of binary words of the pause duration code, a conditioner of a reset signal for the counter of binary words of the pause duration code, and two AND gates. The outputs of the counter of binary words of the pause duration code are connected to other additional data inputs of the data input unit and to the corresponding inputs of the conditioner of the pause duration count control signals. First inputs of the main switching unit are connected, respectively, with the outputs of the pause decoder and of the main pause identifier code decoder, and second inputs of the main switching unit being, respectively, the "timing" and "playback" control inputs of the apparatus. The output of the main switching unit is connected, respectively, with the first input of the conditioner of a signal of binary words of the pause duration code and with the input of the conditioner of a reset signal for the counter of binary words of the pause duration code, having their respective outputs connected with the "C" (count) and "R" (reset) inputs of the counter of binary words of the pause duration code. The output "P" of the counter is connected to the second input of the conditioner of a signal of binary words of the pause duration code, of which the third input is connected to one of the outputs of the control unit and to the first inputs of the AND gates. The other input of the first AND gate is connected to the output of the pause decoder and the output of this AND gate is connected to the corresponding inputs of the pause identifier code shaper, of the control unit and of the conditioner of the pause duration count control signals. The other input of the second AND gate is connected to one of the outputs of the control unit, the output of this logic AND gate being connected to the control input of the data output unit.

For varying the tempo of reproduction of an audio signal, the apparatus preferably further comprises a series connection of a reproduction tempo counter and an additional switching unit having its output connected to the "C" input of the pause duration counter, and the respective control inputs of the additional switching unit being the "record", "playback" and "timing" control inputs of the apparatus. Other control inputs of the additional switching unit are the "normal", "tempo'p' variation" and "tempo 'n' variation" control inputs of the apparatus, the reproduction tempo counter having a "C" input.

The "C" input of the reproduction tempo counter can be the "timing" control input of the apparatus.

To provide for increase in the reproduction tempo, it is quite reasonable for the apparatus to include a frequency generator having its output connected to the "C" input of the reproduction tempo counter.

It is generally known that statistics of audio signals prove that an audio signal may contain pauses of which the real-time duration can be up to 30% of the total duration of audio signals. Hence, the method of recording and reading audio information signals in digital form in accordance with the invention and the apparatus for performing this method can increase the volume of recorded information by up to 30% with continuous audio signals within a given theme. In case of audio information including pauses corresponding to intervals between successive audio signals of different themes, the increase of the volume of recorded information would be correspondingly greater.

In practical application of the method according to the invention and of the claimed apparatus for performance of this method, it is possible that with the existence of a source of noise or distortion the code values of the audio signal can be so distorted that the input signal would include code combinations corresponding to the pause identification code. Then, in the reading out of such a distorted signal, the signal being reproduced would include a false pause of a duration depending on the value of the digital signal following the false pause identification code.

The claimed apparatus performing the method according to the invention is capable of suppressing eventual signal distortions accompanying the operations of compression and decompression, and of enhancing the accuracy of reading out a digital signal by eliminating false pauses.

The claimed apparatus for performing the method in accordance with the invention determines the shaping of a pause duration code with exhaustive combination search accounting for the arbitrary character of possible pause durations, and therefore a digital signal representing the code duration code may include combinations coinciding with the pause identification code. With the initial phase of a signal in the reading out mode being also arbitrary, this pause duration code could be interpreted as the pause identification code, and then the successive audio signal would be interpreted as the code duration code of an arbitrary value including the maximum value. In other words, in the reading out of a properly recorded signal this could produce a false pause of considerable duration. The apparatus for performing the method according to the invention provides for elimination of the reading out of false pauses, thus enhancing the quality of the reproduced audio signal.

Furthermore, the claimed apparatus for performing the method according to the invention is operable for altering the tempo of reproduction of an audio signal without altering its pitch or timbre, both for speeding up and slowing down the initial tempo. The slowing down of the reproduction tempo could be employed for better perception of the recorded audio signal, and the speeding up for accelerated perception of the information. A varied tempo of reproduction of an audio signal can be also used for precisely regulating the time of a transmission, while maintaining the informative contents of the transmission intact.

Thus, a variation of the reproduction tempo (both in the speeding up and slowing down sense) can be employed while preparing a message to be broadcast over radio channels, as the duration of such messages in most cases is quite rigorously prescribed.

A reduction of the reproduction tempo can be used for enhancing the clarity of a recorded message.

An increased tempo of reproduction of a recorded message can be also used for quicker perception of information, for it is commonly known that a human being is able to relate information by his organs of speech significantly slower than to perceive the same information by his organs of hearing.

BRIEF DESCRIPTION OF THE DRAWINGS

The present invention will be further described in connection with its embodiments, with reference being made to the accompanying drawings, wherein.

DESCRIPTION OF THE PREFERRED EMBODIMENTS

Figure 1:
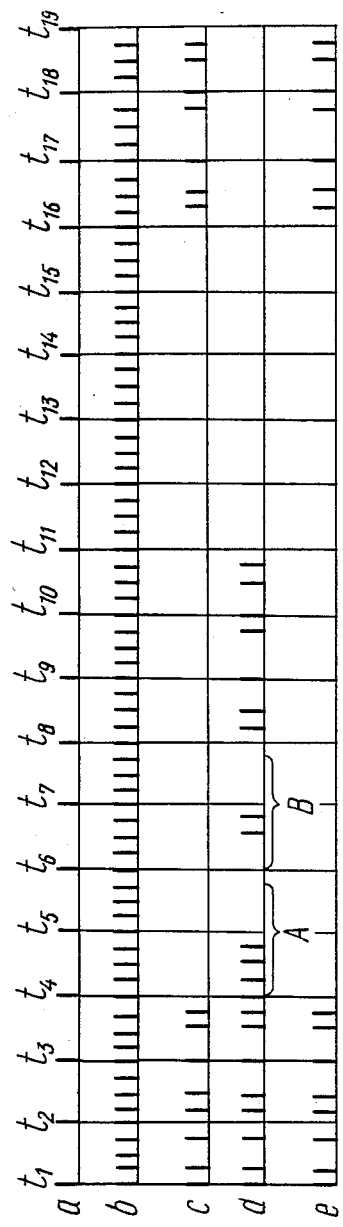
FIGS. 1a, b, c, d, e present time-related charts illustrating a method in accordance with the invention.

The method of recording and reading audio information signal in digital form in accordance with the invention includes time compression of digital signals with their subsequent recording, and reading out digital signals with time decompression. The time compression of digital signals includes detecting a chain or sequence of code values of a digital signal, corresponding to a pause in an audio signal, measuring the duration of the chain of code values of the digital signal, corresponding to the pause in the audio signal, and generating a pause identifier code and a pause duration code for their subsequent recording with the digital signal. During reading out, the time decompression of digital signals includes detecting the pause identifier code and the pause duration code, and using them for restoring the duration of the chain of code values of the digital signal, corresponding to the pause in the audio signal.

The abovedescribed method in accordance with the invention is illustrated by the time-related charts shown in figures, where FIG. 1a depicts signals of time samples $t_1$-$t_{19}$; FIG. 1b depicts clock pulses; FIG. 1c depicts an audio signal in digital form, wherein a pause takes place over time samples $t_4$-$t_{15}$. In accordance with the disclosed method, FIG. 1d shows the compressed audio signal where the time samples $t_4$, $t_5$ (brace A) accommodate a pause identifier code, e.g. of two binary words with logic "1" recorded in every digit of the first word and logic "0" recorded in every digit of the second word. A pause duration code "0011", "0000" is recorded over the samples $t_6$, $t_7$ (brace B) corresponding to a pause of 12 time samples. It can be seen now that the same pause recorded real-time would require 48 cells in the storage, whereas the compressed pause requires 16 sells. In the example being described, 16 memory cells accommodating pause identifier codes and pause duration codes allow compression of pauses of a duration equalling $(2^8-1)$ samples, which corresponds to 1020 memory cells. By detecting during reading out of the recorded signal the pause identifier code and by restoring the duration of the pause by the pause duration code, the original audio signal in digital form can be reproduced (FIG. 1e).

In the example described above, the pause identifier code is selected from chains of code values of the digital signal, known to be absent in an audio signal. Thus, the pause identifier code shown in FIG. 1d has been selected from the reasoning that this chain of codes corresponds to the presence of a harmonic of the highest frequency of the spectrum of the audio signal, having the maximum amplitude, whereas it is known that a harmonic of the highest frequency in most cases has a standard 0.7 amplitude. However, an effect of noise on an ideal audio signal in digital form may result in a situation where the input signal could include code combinations coinciding with the pause identifier code. Then, in the reading out of the record the subsequent audio signal would be identified as the pause duration code, and a false pause would appear in the reproduction of the audio signal.

Figure 2:
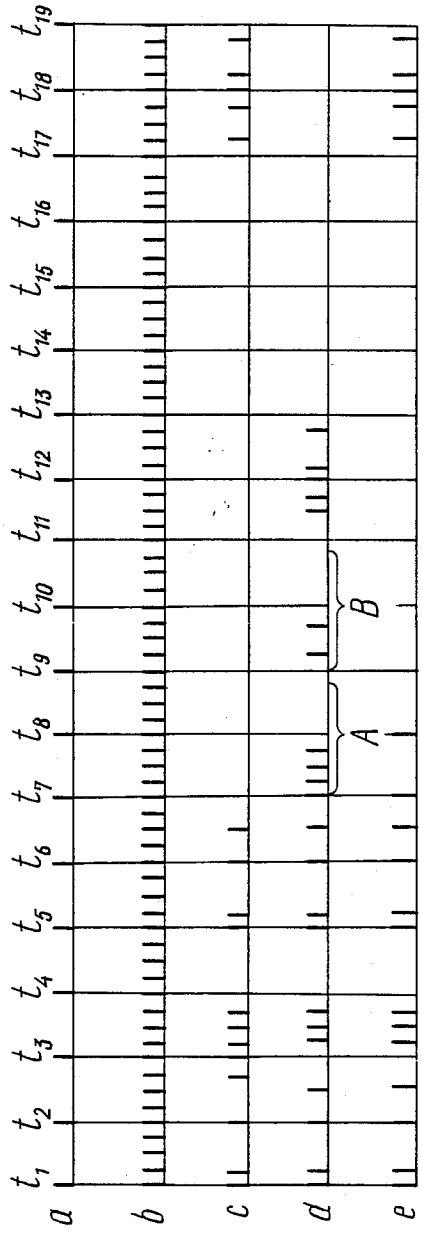
FIGS. 2a, b, c, d, e present time-related charts illustrating a method in accordance with the invention, with elimination of false pauses in recording.

To avoid false pauses in the performance of the method according to the present invention, prior to the time compression of the digital signals the code values of the digital signal are compared with the preselected pause identifier code, and if the comparison proves positive, the code value of the digital signal is distorted by altering one of the minor symbols of the code value of the digital signal. This evolution of the method according to the invention is illustrated by time-related charts shown in FIG. 2 where FIGS. 2a and 2b show, respectively, the time sample signals and clock puses, and FIG. 2c shows the input audio signal in digital form wherein the time samples $t_3$, $t_4$ accommodate a code chain coinciding with the pause identifier code. In accordance with the invention, this part of the audio signal is forcefully distorted (FIG. 2d) so that the effect of this distortion should be minimal; for instance, the "1" value of the lowest digit in the sample $t_3$ has been substituted by "0". The following pause over the samples $t_4$–$t_{16}$ is substituted by the pause identifier code (brace A) and the pause duration code (brace B), and in this form the signal is stored. During reading out (FIG. 2e) the audio signal is reproduced without a false pause introduced, owing to the entered distortion.

In case of existence of two consecutive pauses (FIG. 3a-time sample signals, FIG. 3b - clock signals, FIG. 3c - an audio signal with the first pause over the samples $t_2$–$t_{16}$ and the second pause over the samples $t_{18}$ - ... ), a recorded signal (FIG. 3d) is obtained where in a particular case the pause duration code (brace B over the sample $t_4$, $t_5$) may coincide with the pause identifier code. Then, owing to the random initial phase of the reading out of the recorded signal, e.g. at the initial moment $t_b$ in FIG. 3d, the pause duration code (brace B over the samples $t_4$, $t_5$) is mistaken for the pause identifier code, and the following part of the digital signal (over the samples $t_6$, $t_7$) is mistaken for the pause duration code which in the particular case being described yields a false pause of 377 samples (FIG. 3e). Other code combinations exist which could result in false pauses at the initial phase of the reading out of a digital signal.

To avoid this, in case of existence in the digital signal of two consecutive pauses, following the recording of the pause duration code of the preceding pause the identifier code of the next pause is recorded not earlier than after a time interval equalling the maximum duration of the code duration code. In the reading out mode, prior to time decompression of the digital signal the execution of a pause is permitted on a condition that its identifier code appears not earlier than after a time interval equalling the maximum duration of the pause duration code from the moment of the beginning of the reading out of the audio signal, and if the pause identifier code appears within this time interval, the decoding of this pause identifier code is inhibited, and a new time count equalling the maximum duration of the pause duration code is started.

In correspondence with this evolution of the method according to the present invention, the pause duration code starting at the time sample $t_{18}$ (FIG. 3c) would be recorded in the example being described not at the sample $t_7$ (FIG. 3d), but at the sample $t_8$ (FIG. 3f), as the maximum duration of the pause duration code amounts to two time samples. In the reading out of the thus recorded signal started at the initial moment $t_8$ (FIG. 3f), the first pause identifier code would appear after the interval of a single time sample (time sample $t_4$), whereas the maximum duration of the pause duration code is two time samples, and thus the decoding of this appearing code would be inhibited, and a new count of two time samples would be started from the sample $t_6$. As the next pause identifier code accommodated over the time samples $t_8$, $t_9$ would appear after the count of two time samples, its decoding would be permitted, and starting from the time sample $t_{10}$ the digital signal would be identified as the pause duration code representing 10 time samples, the pause would be counted from the sample $t_8$ to the sample $t_{18}$, and then the audio signal would rightfully appear (FIG. 3g).

With the method according to the present invention being implemented, a digital signal is so processed that pauses are represented not by their real "0" values, but by pause duration codes; thus, to vary the tempo of reproduction of the audio signal, a pause duration code can be converted into a code of a predetermined pause duration corresponding to the selected reproduction tempo. Moreover, with the pause duration codes alone being thus transformed and the audio signal codes remaining intact, the pitch or timbre of the audio signal remains unchanged, but the altered duration of pauses varies the tempo of reproduction of the audio signal. When the tempo of reproduction is intended to be stepped up, it is expedient to alter the pause duration codes prior to the recording of the signal, because in this case the duration of the codes is shortened, and, consequently, more storage capacity can be saved. Correspondingly, when the reproduction tempo is intended to be slowed down, it is expedient to alter the pause duration codes after the reading out, as this yields an increased duration of the codes that could have required an increased storage capacity. In the herein described embodiment of the method in accordance with the invention the conversion of the pause duration code into a code of a predetermined pause duration corresponding to the selected reproduction tempo is carried out during the reading out.

The present disclosure further describes an apparatus for recording audio information signals in digital form, capable of performing the method in accordance with the present invention.

Figure 4:
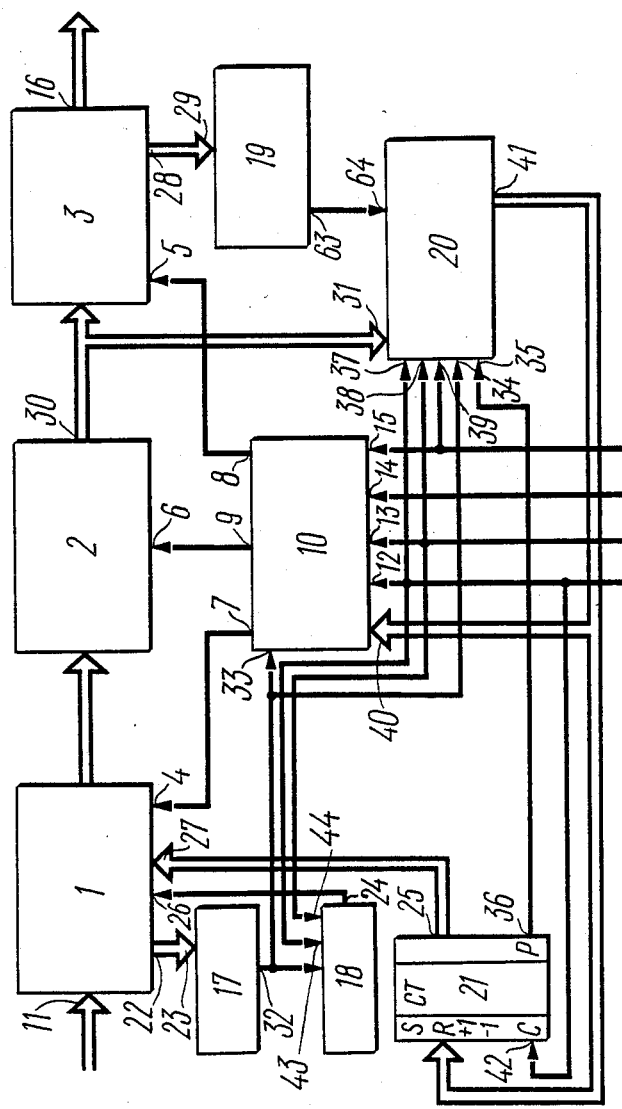
FIG. 4 is a block-unit diagram of the claimed apparatus performing the method illustrated in FIG. 1.

The disclosed apparatus for recording and reading audio information signals in digital form, schematically illustrated in FIG. 4, performs the abovedescribed method according to the invention, as illustrated in FIG. 1, and comprises a series connection of a data input 1 (FIG. 4), a storage 2 and a data output unit 3. Connected to the control inputs 4 and 5 of the data input unit 1 and of the data output unit 3, respectively, and to the timing input 6 of the storage 2 are the corresponding outputs 7, 8 and 9 of the driver or control unit 10. The data inputs 11 of the data input unit 1, the main control inputs 12, 13, 14 and 15, respectively, of the control unit 10 and the main data outputs 16 of the data output unit 3 are, correspondingly, the data inputs, the "timing", "record", "stop" and "playback" control inputs and the data outputs of the apparatus.

The apparatus further comprises a series connection of a pause decoder 17 and a pause identifier code shaper 18, and a series connection of the main pause identifier code decoder 19, a conditioner 20 of pause duration count control signals, and a pause duration counter 21. The additional data outputs 22 of the data input unit 1 are connected to the respective inputs 23 of the pause decoder 17, and the outputs 24 and 25 of the pause identifier code shaper 18 and of the pause duration counter 21, respectively, are connected to the corresponding additional data inputs 26 and 27 of the data input unit 1. The additional data outputs 28 of the data output unit 3 are connected to the corresponding inputs 29 of the main pause identifier code decoder 19. The outputs 30 of the storage 2 are additionally connected to the corresponding inputs 31 of the conditioner 20 of pause duration count control signals. The output 32 of the pause decoder 17 is additionally connected to the additional input 33 of the control unit 10 and to the corresponding input 34 of the conditioner 20 of pause duration count control signals whose control input 35 is connected to the output P 36 of the pause duration counter 21, and whose control inputs 37, 38, 39 are the respective "timing", "record" and "playback" control inputs of the apparatus. The additional control inputs 40 of the control unit 10 are connected to the corresponding outputs 41 of the conditioner 20 of pause duration count control signals. The inputs C 42 and 43 of the pause duration counter 21 and of the pause identifier code shaper 18, respectively, are the "timing" control inputs of the apparatus, and the input 44 of the shaper 18 is the "record" control input of the apparatus.

In the embodiment being described, the data inputs 11 of the data input unit 1 are the data inputs of the apparatus.

Figure 5:
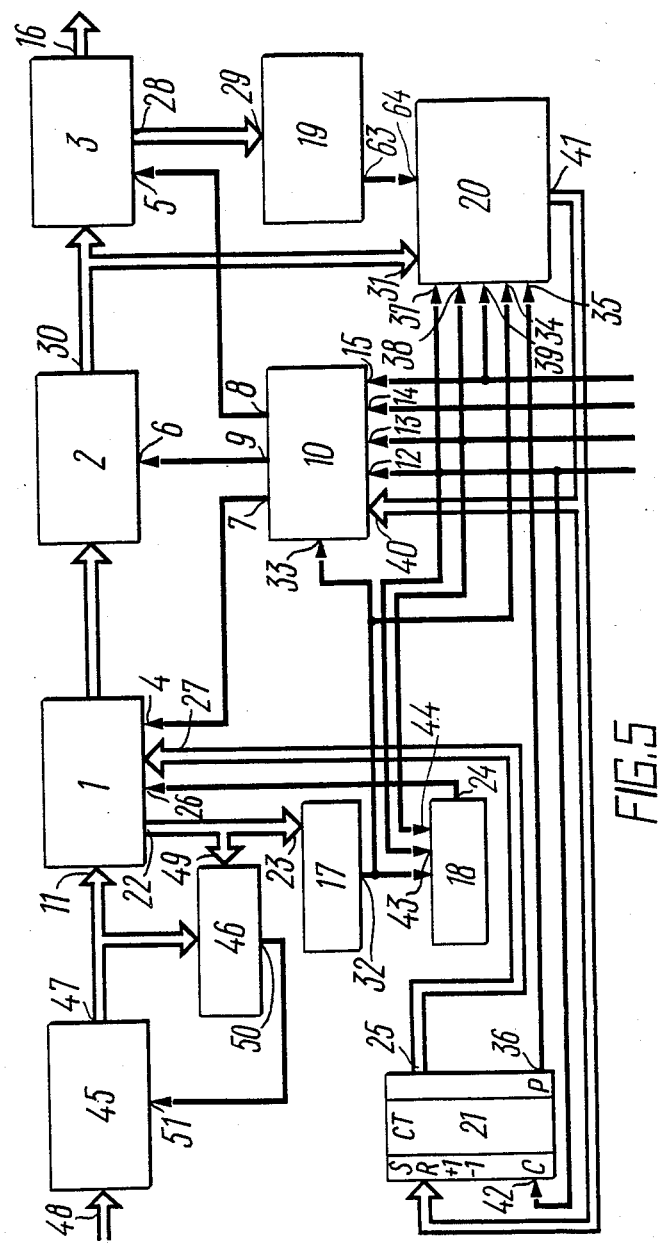
FIG. 5 is a block-unit diagram of the claimed apparatus performing the method illustrated in FIGS. 1 and 2.

The disclosed apparatus for recording and reading audio information signals in digital form, illustrated in FIG. 5 and capable of performing the disclosed method as illustrated in FIGS. 1 and 2, is similar to the apparatus illustrated in FIG. 4 for performing the disclosed method, as illustrated in FIG. 1.

The difference is that the apparatus illustrated in FIG. 5, in order to enhance the accuracy of reading a digital signal, additionally comprises a series connection of a corrector 45 (FIG. 5) of an audio signal code and an additional decoder 46 of a pause identifier code. The outputs 47 of the corrector 45 of an audio signal code are connected to the corresponding data inputs 11 of the data input unit 1. The data inputs 48 of the corrector 45 are the data inputs of the apparatus.

The outputs 49 of the decoder 46 are connected to the additional data outputs 22 of the unit 1, and its output 50 is connected to the control input 51 of the corrector 45 of an audio signal code.

Figure 3:
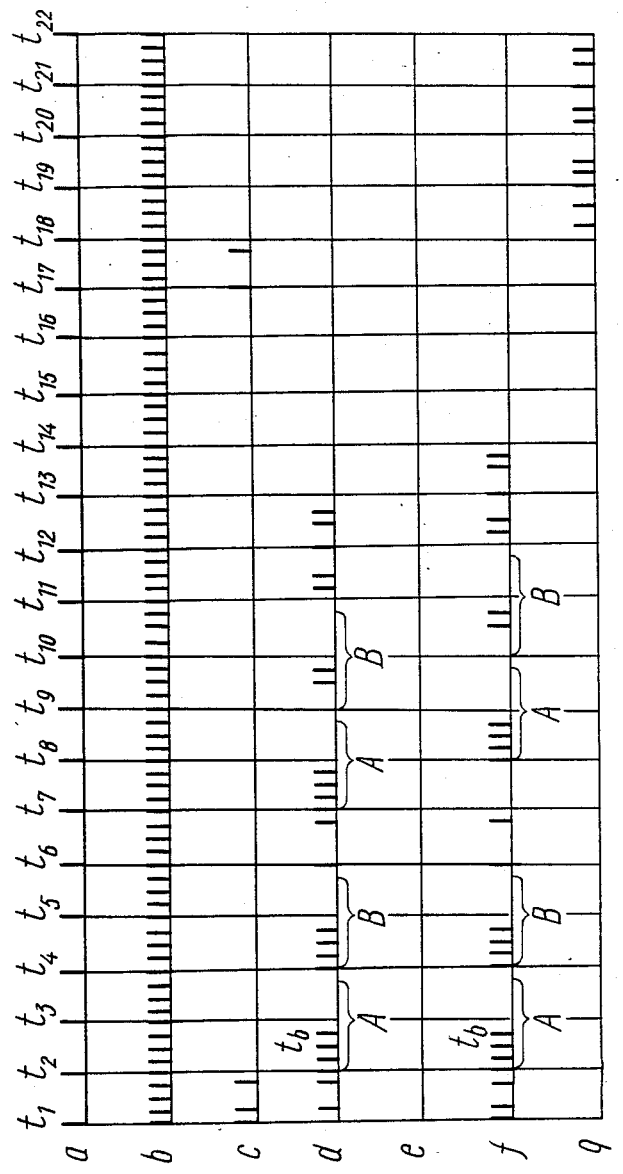
FIGS. 3a, b, c, d, e, f, g present time-related charts illustrating a method in accordance with the invention, with elimination of false pauses in reading out.
Figure 6:
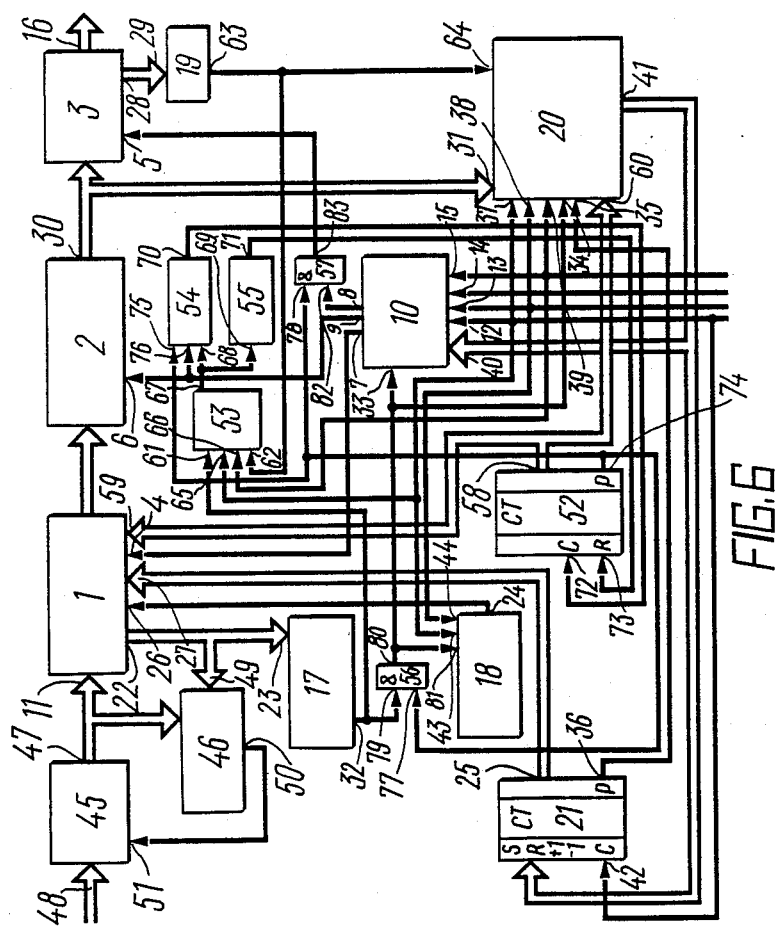
FIG. 6 is a block-unit diagram of the claimed apparatus performing the method illustrated in FIGS. 1, 2 and 3.

The disclosed apparatus in the modification illustrated in FIG. 6, capable of performing the disclosed method as illustrated in FIGS. 1, 2, and 3 is similar to the apparatus illustrated in FIG. 5 for performing the disclosed method as illustrated in FIGS. 1 and 2.

The difference is that, in order to avoid the reading out of false pauses, the apparatus illustrated in FIG. 6 additionally comprises a counter 52 (FIG. 6) of binary words of a pause duration code, a main switching unit 53, a conditioner 54 of a pause duration binary words signal, a conditioner 55 of a reset signal for the counter 52 of binary words of a pause duration code, and two AND gates 56 and 57. The outputs 58 of the counter 52 of binary words of a pause duration code are connected to the additional data inputs 59 of the data input unit 1 and to the corresponding inputs 60 of the conditioner 20 of pause duration count control signals.

First inputs 61 and 62 of the switching unit 53 are connected, respectively, with the outputs 32 and 63 of the pause decoder 17 and of the main pause identifier code decoder 19. The output 63 of the decoder 19 is connected to the input 64 of the signal conditioner 20, as it has been already described hereinabove. The inputs 65 and 66 of the main switching unit 53 are the respective "timing" and "playback" control inputs of the apparatus. The output 67 of the main switching unit 53 is connected, respectively, with the first input 68 of the conditioner 54 of a pause duration code binary words signal and with the input 69 of conditioner 55 of a reset signal for the counter 52 of binary words of a pause duration code, whose respective outputs 70 and 71 are connected to the input C 72 and to the input R 73 of the counter 52 of binary words of a pause duration code. The output P 74 of the counter 52 is connected to the second input 75 of the conditioner 54 of a pause duration code binary words signal, whose third input 76 is connected to the output 9 of the control unit 10 and to the first respective inputs of the AND gates 56 and 57. The other input 79 of the first AND gate 56 is connected with the output 32 of the pause decoder 17, and the output 80 of this AND gate 56 is connected to the respective inputs 81, 33 and 34 of the pause identifier code shaper 18, of the control unit 10 and of the conditioner 20 of pause duration count control signals. The other input 82 of the second AND gate 57 is connected to one of the outputs 8 of the control unit 10, and the output 83 of this AND gate 57 is connected with the control input 5 of the data output unit 3.

Figure 7:
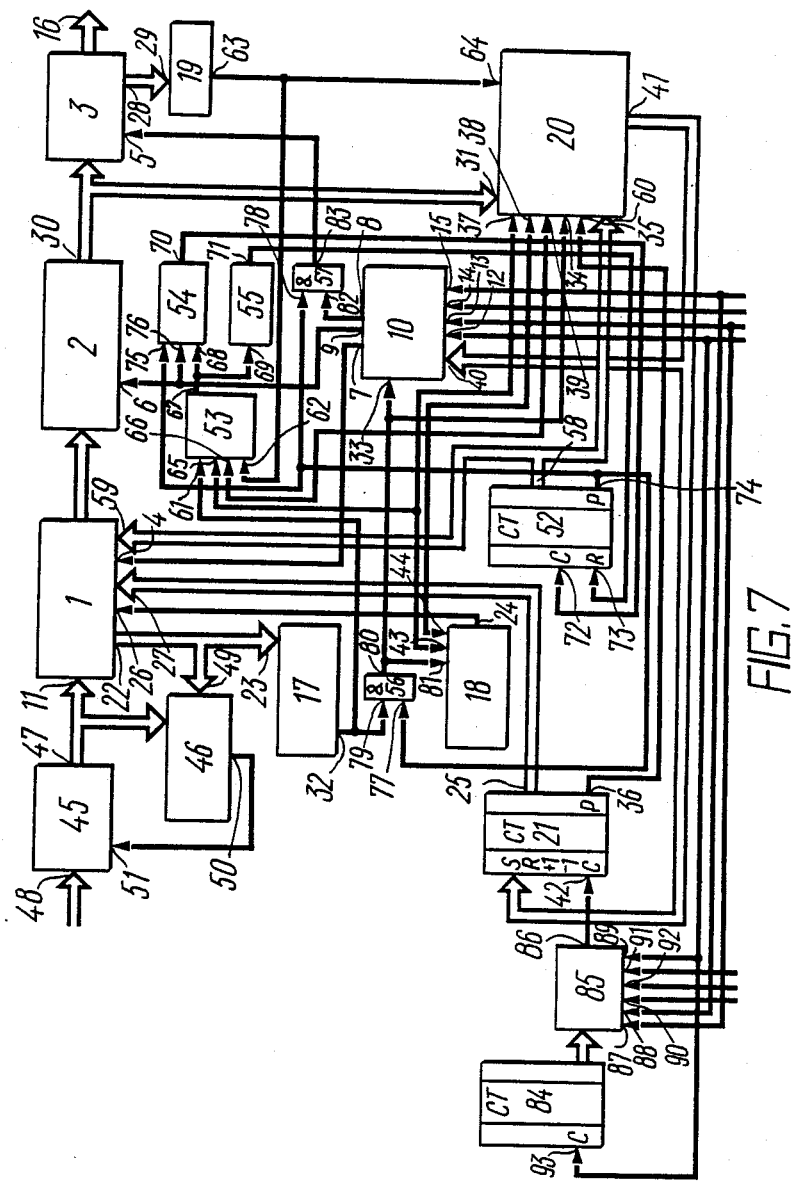
FIG. 7 is a block-unit diagram of the claimed apparatus performing the method according to the invention, capable of slowing down the tempo of reproduction of an audio signal without altering its pitch in reading out.

The disclosed apparatus illustrated in FIG. 7 for performing the method in accordance with the invention is similar to the apparatus illustrated in FIG. 6 for performing the method as illustrated in FIGS. 1, 2 and 3.

The difference is that, in order to provide for slowing down the tempo of reproduction of an audio signal, it additionally comprises a series connection of a counter 84 (FIG. 7) of the tempo of reproduction and an additional switching unit 85. The output 86 of the switching unit 85 is connected to the input C 42 of the pause duration counter 21.

The respective control inputs 87, 88 and 89 of the switching unit 85 are the "record", "playback" and "timing" control inputs of the apparatus. The other control inputs 90, 91 and 92 of the switching unit 85 are the control inputs "normal", "tempo 'p' variation" and "tempo 'n' variation" of the apparatus. The input C 93 of the reproduction tempo counter 84 is the "timing" control input of the apparatus.

Figure 8:
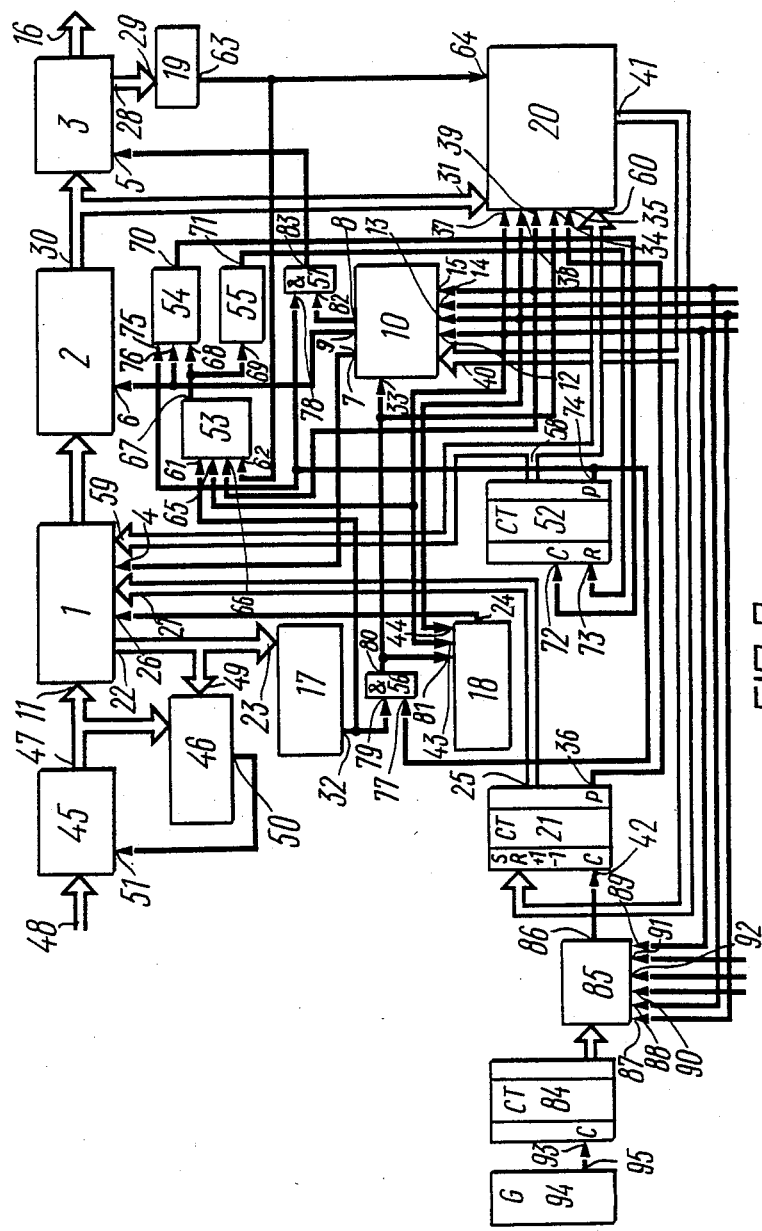
FIG. 8 is a block-unit diagram of the claimed apparatus performing the method according to the invention, capable of speeding up the tempo of reproduction of an audio signal without altering its pitch in reading out.

The disclosed apparatus in the modification illustrated in FIG. 8 for performing the method in accordance with the invention provides for varying the reproduction tempo of an audio signal, including speeding up and slowing down the reproduction tempo of an audio signal without altering its pitch or timbre, and is similar to the apparatus illustrated in FIG. 7 for performing the method according to the invention, providing for varying the tempo of reproduction of an audio signal without altering its pitch or timbre.

The difference is that it additionally comprises a frequency generator 94 (FIG. 8) having its output 95 connected to the input C 93 of the reproduction tempo counter 84.

In the disclosed apparatus described hereinabove in connection with FIGS. 4 to 8, capable of performing the method in accordance with the invention, the pause identifier code decoders 19 and 46, the conditioner 20 of pause duration count control signals, the corrector 45 of an audio signal code, the counter 52 of binary words of a pause duration code, the switching units 53 and 85, the conditioner 54 of the pause duration code binary words signal, the conditioner 55 of a reset signal for the counter 52 of binary words, the reproduction tempo counter 84 and the frequency generator 94 are made of structures known per se to those competent in the art of digital hardware engineering, e.g. by techniques described in the sources cited below:

1. Pyatlin O. A., Ovsishcher P. I., Laser I. M., Kuleshov A. I., Shubarev V. A., ed. by Mayorov S. A. "Proektirovanie mikroelektronnykh tsifrovykh ustroistv" (Designing Microelectronic Digital Devices), 1977, Sovietskoe Radio Publ., Moscow, p.271;

2. Laser I. M., Shubarev V. A. "Ustoichivost tsifrovykh mikroelektronnykh ustroistv" (Stability of Digital Microelectronic Devices), 1983 Radio i Svyaz Publ., Moscow, p.216;

3. Friedman A. D. "Logical Design of Digital Systems", Woodland Hills, Computer Science Press, 1975;

4. Kostopoulos G. K. "Digital Engineering", Wiley, 1975.

The operating principle of the disclosed apparatus illustrated in FIG. 4, performing the method according to the invention as illustrated in FIG. 1, is as follows.

In the "record" mode, an input signal in digital form fed to the data inputs 11 (FIG. 4) of the data input unit 1 is directed to the storage 2 where the signal is recorded under the drive of clock pulses coming from the driver or control unit 10 to the input 6 of the storage 2. A predetermined part of the digital signal is fed from the additional data outputs 22 of the unit 1 to the inputs 23 of the pause decoder 17. When the value corresponding to a pause in the audio signal is present in every digit over a predetermined number of signal samples, the output 32 of the pause decoder 17 feeds out a signal for conditioning the pause identifier code directed via the data input unit 1 to the storage 2. At the same time, the output 9 of the control unit ceases to feed out clock pulses, so that writing in the storage 2 is discontinued; the conditioner 20 of pause duration count control signals feeds out a signal by which the pause duration counter 21 is reset and counts the pause duration by adding clock pulses coming to the input C 42 of this counter 21. When the pause in the audio signal ends, the conditioning of the signal at the output 32 of the pause decoder ceases, and, consequently, the output 9 of the control unit once again feeds out timing pulses for the storage 2, so that, first, the pause duration code shaped at the outputs 25 of the pause duration counter 21 is fed through the data input unit 1 to be written in the storage 2, and then the recording of the audio signal in digital form coming to the data inputs 11 is restored. Thus, instead of a real-life pause, there are written in the storage 2 the pause identifier code and the pause duration code. When a new pause occurs in the audio signal, the above sequence is repeated, with the operation of the pause duration counter 21 starting from its being reset, which is essential as the counter 21 stores the data on the duration of the preceding pause.

In the "stop" mode initiated by a signal sent to the input 14 of the control unit 10, the feeding out of clock pulses by the output 9 of the control unit 10 is ended, and the storage 2 stores the recorded information.

The apparatus is switched for the "playback" mode by a signal coming to the input 15 of the control unit 10, its outputs 7, 8 and 9 sending out signals switching off the data input unit 1 and activating the data output unit 3 to feed out the audio signal in digital form from its data outputs 16. When the digital signal coming from the storage 2 via the data output unit 3 to the main pause identifier code decoder 19 presents a combination corresponding to the pause identifier code, the output of the main pause identifier code decoder feeds out a signal by which the conditioner 20 of pause duration count control signals writes in the counter 21 a code duration code coming to the inputs 31 of the conditioner 20 from the storage 2, and starts this counter 21 in the count-down mode. Simultaneously, in response to signals sent by the conditioner 20 of pause duration count control signals to the inputs 40 of the control unit 10, the timing output 9 of the unit 10 seases feeding out clock pulses for the storage 2, and so "O" values are shaped at the data outputs 16 in all digits of the digital signal. As the counter 21 reaches the zero count, its output P 36 shapes a signal coming to the conditioner 20 of pause duration count control signals, and the latter reactivates the control unit 10 to feed out clock pulses for the storage 2 from its output 9 and the control signal form its output 8, so that the audio signal in digital form is supplied from the storage 2 via the data output unit 3 to the data outputs 16.

The disclosed apparatus in the modification illustrated in FIG. 5 operates in the "record" mode, as follows.

The audio signal in digital form fed to the data inputs 48 is directed via the corrector 45 of an audio signal code to the data inputs 11 of the data input unit 1 and to the corresponding inputs of the additional decoder 46 of the pause identifier code, its other inputs 49 receiving a signal from the outputs 22 of the data input unit 1. If the incoming data signal contains a fragment corresponding to the pause identifier code, the output 50 of the additional decoder 46 of the pause identifier code feeds out a signal coming to the input 51 of the corrector 45, in response to which the latter distorts the code value of the digital signal in one of its minor symbols. Consequently, the audio information signal sent via the data input unit 1 to be written in the storage 2 would not contain a false pause identifier code, and no false pauses would not be reproduced in the "playback" mode.

The other modes of operation of the apparatus illustrated in FIG. 5 are similar to those of the apparatus illustrated in FIG. 4.

The disclosed apparatus in the modification illustrated in FIG. 6 operates, as follows.

In the "record" mode, the apparatus illustrated in FIG. 6 would operate similarly to the apparatus illustrated in FIGS. 4 and 5 when the audio signal being recorded contains a pause.

The difference is that in its initial state the counter 52 of binary words of a pause duration code shapes a carry signal at its output P 74, so that the AND gates 56 and 57 pass the pause signal and the control signal for the data output unit 3, respectively. Upon the pause having ended, the signal at the output 32 of the pause decoder, coming to the input 61 of the switching unit 53, results in the latter forming a signal at its output 67 for the conditioners 55 and 54 to feed out signals from their respective outputs 71 and 70. The first one of the two last-mentioned signals resets the counter 52 of binary words of the pause duration code, while the second signal is counted by this counter 52.

If a pause signal is sent from the output 32 of the pause decoder 17 during this operation of the counter 52, owing to absence of the carry signal at the output P 74 of the counter 52, the AND gate 56 would not pass the pause signal to the input 81 of the pause duration code shaper 18, and so this code would not be shaped and written in the storage 2 through the data input unit 1. Upon having counted the predetermined number of binary words, the counter 52 sends out a carry signal, thus permitting to shape the pause identifier code at the output 24 of the shaper, to be written in the storage 2 through the data input unit 1, and then, owing to corresponding values of the signals at the outputs 58 of the counter 52 fed to the inputs 60 of the signal conditioner 20, the counting of the duration of this pause is started. Thus, in the "record" mode two successive pauses can be recorded not closer than spaced by the time interval corresponding to the maximum duration of the pause duration code.

The "stop" mode of the apparatus illustrated in FIG. 6 is similar to the "stop" mode of the apparatus illustrated in FIGS. 4 and 5.

At the beginning of the "playback" mode, signals coming from the outputs 71 and 70 of the conditioners 55 and 54 trigger the counter 52. Simultaneously, clock pulses are sent to the input 6 of the storage 2. However, the audio signal in digital form would not appear at the outputs 16 because the AND gate 57 would be closed until a carry signal is sent from the output P 74 of the counter 52. If no pause signal is fed out by the output 63 of the pause identifier code decoder 19 during the first cycle of operation of the counter 52, in response to the carry signal sent out by the output P 74 of the counter 52 the output 83 of the AND gate 57 would send a signal to the input 5 of the data output unit 3, and the data coming from the storage 2 would be transmitted to the data outputs 16. Alternatively, if a signal is sent by the output 63 of the pause identifier code decoder 19 during the first cycle of operation of the counter 52, signals are successively sent out by the switching device 53 and the conditioners 55 and 54, the signals clearing the counter 52 and starting a new cycle of its operation.

In this second cycle of the operation of the counter 52 of binary words of the pause duration code, the same terms of its performance remain as in the first cycle, i.e. if no signal comes from the output 63 of the decoder 19, the data would be sent from the storage 2 to the data outputs 16 after this cycle of operation of the counter 52 is completed. If, on the other hand, during this second cycle of the operation of the counter 52 a signal comes from the output 63 of the decoder 19, the counter 52 would be reset, and the third cycle of its operation would be started. Owing to the recorded data positively including a time interval introduced during the recording, equalling the duration of the pause duration code and containing no pause identifier code, a situation would positively take place where during the operating cycle of the counter 52 no pause identifier code would be contained in the signal coming from the storage 2, and upon the occurrence of such a situation normal playback of the information from the storage 2 would be started.

The rest of the operation of the apparatus illustrated in FIG. 6 in the "playback" mode is identical to the operation of the apparatus illustrated in FIGS. 4 and 5.

Thus, any random initial phase of the playback of a signal would result in reproduction of the audio signal without false pauses.

The disclosed embodiment of the apparatus, illustrated in FIG. 7, operates in the "record" mode similarly to the embodiments illustrated in FIGS. 4, 5 and 6.

The difference is that, when the duration of a pause is counted, clock pulses are fed to the input C 42 (FIG. 7) of the pause duration counter 21 through the switching unit 85, owing to the "record" mode signal being sent to the input 87 of the switching unit 85.

The apparatus illustrated in FIG. 7 operates in the "stop" mode similarly to the apparatus illustrated in FIGS. 4, 5 and 6.

In the "playback" mode, the apparatus illustrated in FIG. 7 operates similarly to the apparatus illustrated in FIGS. 4, 5 and 6, with the difference that as the duration of a pause to be reproduced is counted, the frequencies of clock pulses coming to the input 93 of the reproduction tempo counter 84 are divided by the latter by pulses of a corresponding frequency, and thus fed via the switching device 85 to the input C 42 of the pause duration counter 51. Thus, the reproduced pause may selectively be either of a normal duration, or of the normal duration multiplied p . . . n times.

The operation of the disclosed apparatus in the embodiment illustrated in FIG. 8 in every mode is similar to the operation of the apparatus illustrated in FIG. 7.

The difference is that in the "playback" mode the signal coming from the frequency generator 94 (FIG. 8) at a $f_g$ frequency is fed to the input 93 to the reproduction tempo counter 84. Correspondingly, the frequency of the signal coming to the input C 42 of the pause duration counter 21 would be either the frequency of clock pulses, or the frequency of pulses coming from the generator 94, divided by either "p" or "n".

This would result in reproduction of pauses either in real time, or curtailed $f_g p/f_c$ or $f_g n/f_c$ times, where $f_c$ is the frequency of clock pulses;

"p" and "n" are the factors of division of the frequency of the generator 94 at the respective outputs of the counter 84.

It can be seen that the curtailing of pause durations would result in the reproduction tempo of the audio signal being stepped up in proportion with the values "p" or "n".

The disclosed apparatus for recording and reproducing audio information signals in digital form, performing the method according to the invention, provides for significantly saving the capacity of a storage, while ensuring high-fidelity reproduction of the audio signal, and also for controlling the reproduction tempo of the audio signal.

The invention can be employed in systems for preparing and receiving radio broadcasts.

We claim:

1. A method of recording and reading audio information signals in digital form, comprising the steps of: comparing the code values of the digital signal with a predetermined pause identifier code; distorting the code value of the digital signal by altering one of the minor symbols of the code value of the digital signal if the result of the comparison coincides; detecting a chain of code values corresponding to a pause in an audio signal; measuring the duration of the chain of code values of the digital signal corresponding to the pause in the audio signal; compressing the digital signal, which is performed by generating a pause identifier code and a pause duration code for their subsequent recording with the digital signal; reading out of the digital signal; detecting the pause identifier code and the pause duration code by which the time decompression is performed and using them for restoring the duration of the chain of code values of the digital signal corresponding to the pause in the audio signal.

2. A method of recording and reading audio information signals in digital form as claimed in claim 1 which includes converting a pause duration code into another pause duration code corresponding to a predetermined reproduction tempo.

3. A method of recording and reading audio information signals in digital form as claimed in claim 2, in which the conversion of a pause duration code into another predetermined pause duration code corresponding to a predetermined reproduction tempo is effected during reading out.

4. A method of recording and reading audio information signals in digital form, as claimed in claim 1 wherein, in case of occurrence in the digital signals of two successive pauses, recording of the duration code of the preceding pause is followed by the recording to the identifier code of the successive pause not earlier than after a time interval corresponding to the maximum duration of the pause code, during reading out, prior to time decompression of the digital signals, the generation of the first pause is allowed only if its identifier code appears not earlier than after a time interval corresponding to the maximum duration of the pause duration code from the moment of the beginning of the reading out of the audio signal, and if a pause identifier code appears during this time, the decoding of this pause identifier code is inhibited, and a new count of the time interval corresponding to the maximum duration of the pause duration code is initiated.

5. A method of recording and reading audio information signals in digital form as claimed in claim 4 which includes converting a pause duration code into another pause duration code corresponding to a predetermined reproduction tempo.

6. A method of recording and reading audio information signals in digital form as claimed in claim 5 in which the conversion of a pause duration code into another predetermined pause duration code corresponding to a predetermined reproduction tempo is effected during reading out.

7. A method of recording and reading audio information signals in digital form as claimed in any one of claims 1 to 4, which includes converting a pause duration code into another pause duration code corresponding to a predetermined reproduction tempo.

8. A method of recording and reading audio information signals in digital form as claimed in claim 7, in which the conversion of a pause duration code into another predetermined pause duration code corresponding to a predetermined reproduction tempo is effected during reading out.

9. An apparatus for recording and reading audio information signals in digital form, comprising a series connection of a data input unit, a storage and a data output unit, the data input unit having main data inputs and outputs, the control inputs, respectively, of the data input unit and of the data output unit and the timing input of the storage having connected thereto the corresponding outputs of the control unit, the main control inputs of the control unit and the main data outputs of the data output unit being, respectively, the "timing", "record", "stop" and "playback" control inputs and the data outputs of the apparatus also having data inputs; a series connection of a pause decoder and a pause identifier code shaper; and a series connection of a main pause identifier code decoder, a conditioner of pause duration count control signals and a pause duration counter, the additional data outputs of the data input unit being connected to the respective inputs of the pause decoder, and the outputs of the pause identifier code shaper and of the pause duration counter being connected, respectively to the corresponding additional data inputs of the data input unit, the additional data outputs of the data output unit being connected to the corresponding inputs of the main pause identifier code decoder, the outputs of the storage being additionally connected to the corresponding inputs of the conditioner of pause duration count control signals, the output of the pause decoder being additionally connected to an additional input of the control unit and to the corresponding input of the conditioner of pause duration count control signals having connected to one of the control inputs thereof an output "P" of the pause duration counter, other control inputs being "timing", "record" and "playback" control inputs of the apparatus, additional control inputs of the control unit (10) being connected to the corresponding outputs of the conditioner of pause duration count control signals, an input "C" of the pause duration counter and the corresponding inputs of the pause identifier code shaper being the "timing" and "record" control inputs of the apparatus: a series connection of an audio signal code corrector and an additional pause identifier code decoder, the data inputs of the corrector being the data inputs of the apparatus, the outputs of the audio signal code corrector being connected to the corresponding data inputs of the data input unit, the inputs of the additional pause identifer code decoder being connected to additional data outputs of the data input unit, and the output thereof being connected to the control input of the audio signal code corrector.

10. An apparatus for recording and reading audio information signals in digital form as claimed in claim 9 which comprises a series connection of a reproduction tempo counter and an additional switching unit having its output connected to the input "C" of the pause duration counter, the respective control inputs of the additional switching unit being the "record", "playback", and "timing" control inputs of the apparatus, and other inputs of this additional switching unit being the "normal", "tempo 'p' variation" and "tempo 'n' variation" control inputs of the apparatus, the reproduction tempo counter having a count input "C".

11. An apparatus for recording and reading audio information signals in digital form as claimed in claim 10, in which the input "C" of the reproduction tempo counter is the "timing" control input of the apparatus.

12. An apparatus for recording and reading audio information signals in digital form as claimed in claim 10, which comprises a frequency generator having its output connected to the input "C" of the reproduction tempo counter.

13. An apparatus for recording and reading audio information signals in digital form as claimed in claim 9, which comprises a counter of binary words of the pause duration code; a main switching unit; a conditioner of a signal of binary words of the pause duration code; a conditioner of a reset signal for the counter of binary words of the pause duration code and two AND gates, the outputs of the counter of binary words of the pause duration code being connected to other additional data inputs of the data input unit and to the corresponding inputs of the conditioner of pause duration count control signals, first inputs of the main switching unit being connected, respectively, with the outputs of the pause decoder and of the main pause identifer code decoder, and second inputs of the main switching unit being, respectively, the "timing" and "playback" control inputs of the apparatus, the output of the main switching unit being connected, respectively, with the first input of the conditioner of a signal of binary words of the pause duration code and with the input of the conditioner of a reset signal for the counter of binary words of the pause duration code, having their respective outputs connected with the input "C" and input "R" of the counter of binary words of the pause duration code, having its output "P" connected to the second input of the conditioner of a signal of binary words of the pause duration code, of which the third input is connected with one of the outputs of the control unit and with the first inputs of the respective AND gates, the second input (79) of the first AND gate being connected with the output of the pause decoder and the output of this AND gate being connected to the corresponding inputs of the pause identifier code shaper, of the control unit and of the conditioner of pause duration count control signals, the other input of the second AND gate being connected to one of the outputs of the control unit, and the output of this AND gate being connected to the control input of the data output unit.

14. An apparatus for recording and reading audio information signals in digital form as claimed in claim 13, which comprises a series connection of a reproduction tempo counter and an additional switching unit having its output connected to the input "C" of the pause duration counter, the respective control inputs of the additional switching unit being the "record", "playback", and "timing" control inputs of the apparatus, and other inputs of this additional switching unit being the "normal", "tempo 'p' variation" and "tempo 'n' variation" control inputs of the apparatus, the reproduction tempo counter having a count input "C".

15. An apparatus for recording and reading audio information signals in digital form as claimed in claim 14, in which the input "C" of the reproduction tempo counter is the "timing" control input of the apparatus.

16. An apparatus for recording and reading audio information signals in digital form as claimed in claim 14, which comprises a frequency generator having its output connected to the input "C" fo the reproduction tempo counter.

17. An apparatus for recording and reading audio information signals in digital form as claimed in either of the claim 9 or 13 which comprises a series connection of a reproduction tempo counter and an additional switching unit having its output connected to the input "C" of the pause duration counter, the respective control inputs of the additional switching unit being the "record", "playback", and "timing" control inputs of the apparatus, and other inputs of this additional switching unit being the "normal", "tempo 'p' variation" and "tempo 'n' variation" control inputs of the apparatus, the reproduction tempo counter having a count input "C".

18. An apparatus for recording and reading audio information signals in digital form as claimed in claim 17, in which the input "C" of the reproduction tempo counter is the "timing" control input of the apparatus.

19. An apparatus for recording and reading audio information signals in digital form as claimed in claim 17, which comprises a frequency generator having its output connected to the input "C" of the reproduction tempo counter.

* * * * *